United States Patent [19]

Ayers et al.

[11] Patent Number: 4,886,169

[45] Date of Patent: Dec. 12, 1989

[54] BELLOWS CLAMP ACTUATOR

[75] Inventors: Joe W. Ayers, Sherman; William D. Autery, Richardson, both of Tex.

[73] Assignee: Texas Instruments Incorporated, Dallas, Tex.

[21] Appl. No.: 309,895

[22] Filed: Feb. 14, 1989

Related U.S. Application Data

[63] Continuation of Ser. No. 108,200, Oct. 13, 1987, abandoned.

[51] Int. Cl.⁴ .................... B25B 11/00; A45D 42/14; F16B 47/00; A47H 33/00
[52] U.S. Cl. .................................. 206/591; 206/594; 206/587; 206/334; 248/363; 269/21; 269/56
[58] Field of Search .................... 248/363; 211/41; 206/524.8, 591, 594, 587, 334, 328; 269/21, 56; 220/93

[56] References Cited

FOREIGN PATENT DOCUMENTS 2750791 5/1979 Fed. Rep. of Germany ... 206/524.8
1006318 3/1983 U.S.S.R. .............................. 206/591

Primary Examiner—William Price
Attorney, Agent, or Firm—B. Peter Barndt; James T. Comfort; Melvin Sharp

[57] ABSTRACT

A bellows clamp actuator (10) is provided for holding a semiconductor slice cassette (14) within a container (12). The bellows clamp actuator (10) has a V-bar clamp (40), a hollow bellows (38) and a mounting device (56). The bellows clamp actuator (10) is mounted to the door (18) of the container (12). A hole (72) connects the chamber (67) with the atmosphere external the container (12). When a vacuum is drawn within the container (12), the pressure difference causes the bellows (38) to extend and the V-bar clamp (40) to contact and secure the cassette (14) against the vertical guide posts (36).

27 Claims, 1 Drawing Sheet

BELLOWS CLAMP ACTUATOR

This application is a Continuation, of application Ser. No. 108,200, filed Oct. 13, 1987, now abandoned.

TECHNICAL FIELD OF THE INVENTION

This invention relates in general to clamping devices and methods, and in particular to a bellows clamp actuator and method for holding a silicon semiconductor slice cassette.

BACKGROUND OF THE INVENTION

In semiconductor vacuum processing, semiconductor slices are stored in cassettes formed from plastic or other suitable material. The plastic cassettes are then placed in a vacuum container, and the semiconductor slices are removed, often by robot arms, from the cassettes for various processing steps to form complete semiconductor devices. Over time, these cassettes can become warped from exposure to heat or damaged from handling. When damage to the cassette occurs, it becomes difficult to program an automatic robot arm to accurately locate and remove the slice from the cassette, as robot arms require exact alignment of the semiconductor slices. It is, therefore, desirable to ensure that the cassette is positioned so that the semiconductor slices are very accurately aligned. To achieve accurate positioning of a slice, it is necessary to force the cassette square, i.e., vertical surfaces vertical and horizontal surfaces horizontal, to remove the effects of any bending or warping that has occurred to the cassette.

In an attempt to properly position and hold the cassettes in a vacuum container, several unsatisfactory alternatives have heretofore been developed. One alternative involves the use of hydraulically or pneumatically activated clamp fingers which are used to grip the vertical sidewalls of the cassette and force them against the walls of the vacuum container in which they are positioned for use. The use of these fingers generally suffice to secure the cassette in place, but will not compensate for any warpage or bend in the cassette. Therefore, the semiconductor slices may not be accurately positioned in case of damage to the cassette.

Another alternative heretofore developed involves the use of a hydraulically or pneumatically activated cylinder having an attached push plate. When the cassette is placed in position in a vacuum, the hydraulic or pneumatic cylinder is activated to press the plate against the back of the cassette, forcing the cassette against the wall of the vacuum container. Again, this method will suffice to secure the cassette in place, but does not compensate for any warpage or bend in the cassette and the semiconductor slice may thus not be accurately positioned.

Other alternatives have been developed that will compensate for warpage or bend as well as secure the cassette in place. These methods are complex devices that include hydraulic or pneumatic cylinders that pass through the walls of the vacuum container. Any device that passes through the walls of the container will create an opening that must be sealed to keep the vacuum. These alternative methods have not provided a simple device that compensates for warpage or bend and still provides an effective seal. Thus, a need has arisen for a holding and clamping device that will properly position the cassette and compensate for any warpage or bend in the cassette so that the semiconductor slices are very accurately positioned for removal by an automatic robot arm or device and still maintain a vacuum within the container.

SUMMARY OF THE INVENTION

The present invention disclosed and claimed herein describes a method and apparatus for securing and accurately positioning a semiconductor slice cassette which substantially eliminates problems associated with prior holding and clamping devices. The present invention allows the holding of a cassette in an evacuated container so as to position a semiconductor slice in the cassette in a precise attitude for removal by an automatic device.

In accordance with one aspect of the present invention, a clamp is attached to a bellows, which is in-turn attached to a support structure. The clamp is designed to contact and hold a work station, such as a semiconductor slice cassette. The clamp and the bellows are extended so as to contact the work station, which is thus secured in position.

In accordance with another aspect of the present invention, a pair of guide posts are installed in a semiconductor slice processing container or load lock. The guide posts are a metal which is selected to prevent the generation of any unwanted stray particles which may contaminate the evacuated container and the semiconductor slice. The guide posts are designed to receive the vertical front sidewalls of the cassette in the precise vertical and parallel attitude required to level the semiconductor slices in the cassette.

The cassette is forced against the guide posts and, therefore, squared into position by a bellows clamp actuator. The bellows clamp actuator comprises a V-bar clamp which contacts the top rear horizontal edge of the cassette. The V-bar clamp is attached to a bellows which is in turn secured to the back wall of the load lock. The interior of the bellows communicates through a hole in the back of the container with the outside atmosphere. The cassette is placed in the container which is closed and a vacuum is drawn within the container. As the vacuum is drawn, the bellows expands due to the difference in internal and external pressure which forces the V-bar clamp against the top rear horizontal edge of the cassette. The cassette is thus forced into the guide posts squaring the cassette and compensating for any warpage or bending.

It is a technical advantage of the present invention that it compensates for any warpage that may have occurred to a cassette over time. By removing the warpage, it is possible to provide a level cassette, a level semiconductor slice and, thus a work station, that is adaptable to automatic handling devices. It is another technical advantage of the present invention that no extra openings are created that may compromise the integrity of the vacuum within the load lock. It is another technical advantage that no mechanisms, such as cylinders and their associated controls passing through the walls of the container, are required.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
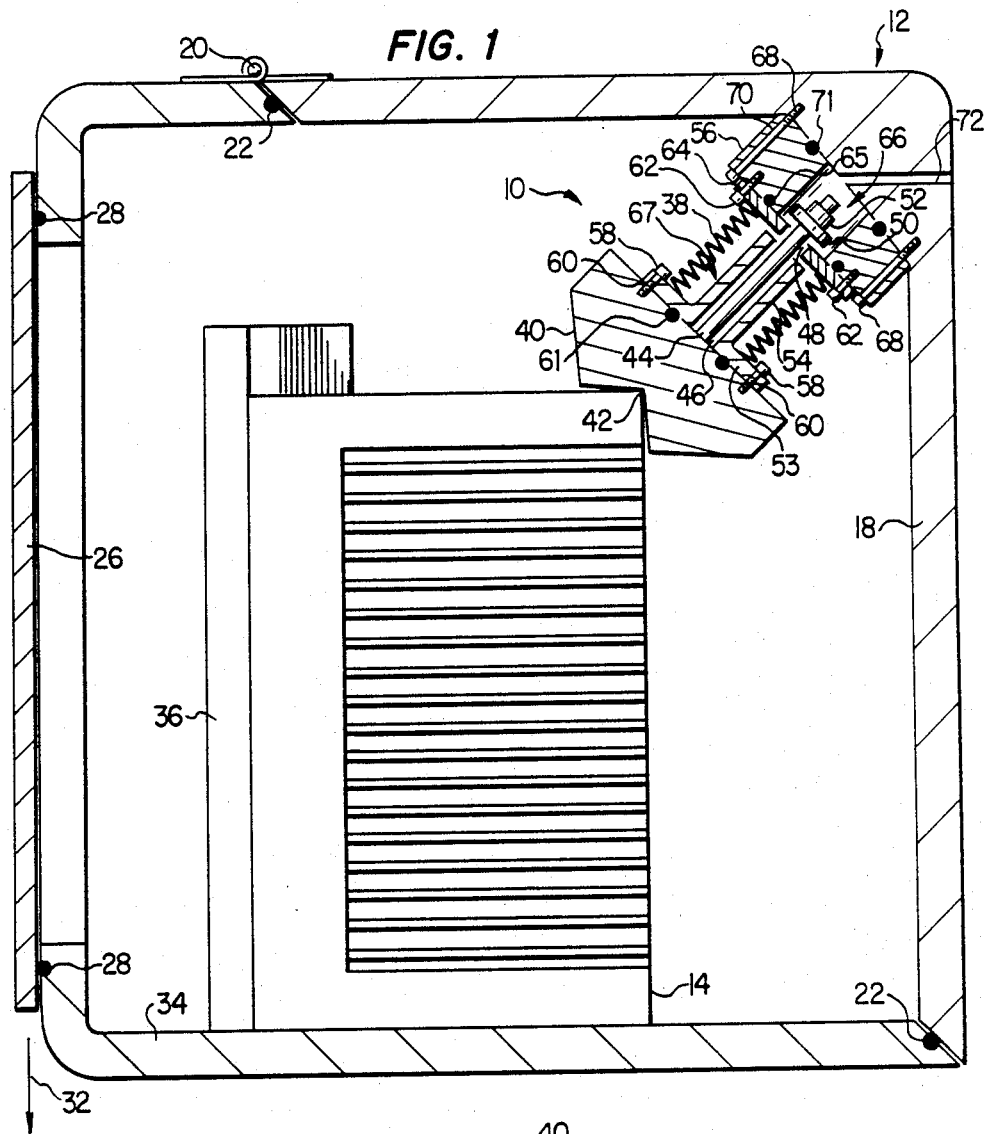
FIG. 1 is a cross-sectional side view of the preferred embodiment of the present invention.

Referring to FIG. 1, the bellows clamp actuator of the present invention is generally identified by the reference numeral 10. The bellows clamp actuator 10 is used in combination with an evacuated load lock or container 12 which is used for receiving and holding a work station such as a conventional semiconductor slice cassette 14. The container 12 is designed to create a clean, particle free environment for the semiconductor slice. It is desirable to maintain a clean, particle free environment for the semiconductor slice, because the circuitry on the slice is so small it can be shorted out or otherwise negatively affected by submicron particles, such as dirt or dust in the air.

The container 12 is made of a metallic substance, for example aluminum, which is selected to prevent particle emission into the atmosphere. The container 12 includes a door 18 which swings open on a hinge 20 and is sealed with an air seal 22. The container 12 is also provided with a gate 26 which has a seal 28. Although not shown, the container 12 is normally secured to another evacuated container which is accessed through the gate 26. When the container 12 is evacuated, the gate 26 slides downward in the direction of arrow 32 for access from the other evacuated container, not shown.

Secured to the floor 34 of the container 12 is a pair of vertical guide posts 36, one of which is shown in FIG. 1. The guide posts 36 are perpendicular to the floor 34 and are parallel to each other. The guide posts 36 may be integral with or secured to a horizontal support piece (not shown) which would, in-turn, be secured or integral with the floor 34. The guide posts 36 are constructed and arranged so as to receive the semiconductor slice cassette 14, as will be described more fully below, and to form an opening through which a semiconductor slice may be removed.

The bellows clamp actuator 10 comprises a hollow bellows 38. The bellows 38 is fixably attached at one end to a V-bar clamp 40 which is designed to fit the top rear horizontal edge 42 of the cassette 14. Although not shown, the clamp 40 could have various other shapes to include a flat bar. A shaft 44 is integral with the clamp 40. The bellows 38 has holes 46 and 48 through which the shaft 44 passes. When the shaft 44 is passed through the hole 48, a washer 50 is secured to the shaft by a retaining ring 52. The shaft 44 and the washer 50 prevent overextension of the bellows 38 by acting as a stop. Integral with the bottom plate 53 of the bellows 38 is a support cylinder 54 which is provided to prevent excessive side-to-side movement of the bellows 38.

The bellows 38 is connected to the clamp 40 by any appropriate method, such as, for example, bolts 58 through holes 60, and is sealed by O-ring 61. The bellows 38 is then connected to a mounting device 56 by any appropriate method, such as, bolts 62 through holes 64, and sealed by O-ring 65. The mounting device 56 is hollow and forms a void 66. The mounting device 56 is in turn secured to the door 18 by any appropriate means such as, for example, bolts 68 through holes 70, and is sealed by O-ring 71. A hole 72 is drilled through the door 18 to connect the void 66 to the open atmosphere exterior the container 12. The void 66 is connected to a chamber 67 through the hole 48. The chamber 67 is formed by the hollow interior of the bellows 38.

Figure 2:
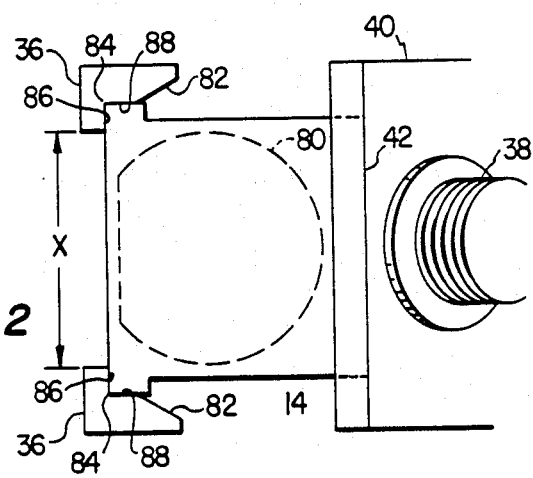
FIG. 2 is a top view of the guide posts and cassette of the invention.

Referring to FIG. 2, the guide posts 36 and the cassette 14 are seen in a top view. Shown in dotted lines is a silicon semiconductor slice 80. The guide posts 36 are seen to be generally L-shaped and are mirror images of each other. The guide posts 36 have sloping surfaces 82 which lead to notched portions 84. Notched portions 84 are constructed and arranged so as to match the front edges 86 and the side edges 88 of the cassette 14. The guide posts 36 are spaced apart a distance X so that the notched portions 84 correspond precisely with the width of the cassette 14. Thus, it can be seen that when pressure is applied to the back edge 42 by the clamp 40, the cassette 14 is firmly wedged into and against the guide posts 36. This action forces the cassette 14 square, allowing the semiconductor slice 80 to be accurately positioned in the desired horizontal orientation.

In the operation of the present invention, the container 12 is opened by swinging the door 18 about hinge 20. An operator (or an automatic device) places a cassette 14 in the container 12 by positioning it against the guide post 36. At this time, it should be noted that the gate 26 would be in its closed position. The door 18 is then swung downward about hinge 20 and secured in place. A vacuum is now drawn within the container 12 (vacuum pump and associated connections not shown). A pressure differential is created by evacuating the container 12. Due to the hole 72 in the door 18, atmospheric pressure remains within the chamber 67 and the bellows 38. This pressure differential is transmitted to the surface of the clamp 40.

Atmospheric pressure, approximately 14.7 pounds per square inch, is transmitted to the clamp 40 and results in an extension of the clamp actuator 10 in the direction of an arrow 74. The extension of clamp actuator 10 in the direction of the arrow 74 results in pressure against the cassette 14 at the edge 42. This pressure in the direction of the arrow 74 results in a horizontal pressure as indicated by arrow 76 and a vertical pressure as indicated by arrow 78. These pressures, as indicated by arrows 76 and 78, force the cassette 14 into the guide posts 36 which in turn, squares the cassette 14 and removes any warpage in the cassette 14. The cassette 14 is now properly positioned and the semiconductor slices are maintained in a precise level position. The gate 26 may now be opened in the direction of the arrow 32, and the semiconductor slices may be removed from the cassette 14 by an automatic device (not shown).

Although the present invention has been described with respect to a specific preferred embodiment thereof, various changes and modifications may be suggested to one skilled in the art and it is intended that the present invention encompass such changes and modifications as fall within the scope of the appended claims.

What is claimed is:

1. Apparatus for accurately securing a work station within an enclosed container, comprising:
   said enclosed container;
   said work station disposed within said enclosed container;
   an extendible member having substantially opposing end portions, one said end portion of said extendible member for contacting and securing said work station and a second end portion of said extendible member attached to the interior of said container; and
   means responsive to a predetermined pressure difference between the interior and the exterior of said enclosed container for extending said extendible member to cause said extendible member to engage the work station with sufficient force to compensate for any deformation of the work station to maintain the work station in the desired precise position.

2. The apparatus for securing a work station of claim 1, wherein the work station comprises a semiconductor slice cassette and wherein said cassette is positioned to enable precise positioning of semiconductor slices within.

3. The apparatus for securing a work station of claim 1, wherein said extendable member comprises a bellows and wherein said means for extending said bellows comprises a cylinder with an extendable piston secured at a first end to a clamp and at a second end to said enclosed container.

4. Apparatus for accurately securing a work station within an enclosed container, comprising:
an extendible member attached at one end to a clamp for contacting the work station;
said extendable member attached at a second end to the interior of the container; and
means for extending said member and said clamp to engage the work station with sufficient force to compensate for any deformation of the work station to maintain the work station in the desired precise position;
wherein a pressure difference is created between the interior of the enclosed container and the exterior of the enclosed container;
wherein said extendable member comprises a bellows and said means for extending said bellows comprises:
a support structure attached to the container;
said clamp, said bellows and said support structure forming an internal chamber; and
means for communicating between said internal chamber and the exterior of the container, so that said pressure difference will exert a force within said internal chamber to cause said bellows to extend and secure the work station.

5. The apparatus of claim 4 and further comprising;
seals positioned within said internal chamber to make the chamber airtight.

6. The apparatus of claim 4, wherein said means for communicating comprises a hole formed through said container into said internal chamber.

7. Apparatus for securing and precisely positioning a semiconductor slice cassette in a vacuum container, comprising:
a clamp constructed and arranged to substantially conform to the shape of a surface portion of said cassette;
a hollow bellows having first and second end portions at opposite ends thereof, said bellows being attached at said first end portion thereof to said clamp;
a cover enclosing said cassette and forming said vacuum container;
said bellows attached at said second end portion thereof to said cover; and
means responsive to a predetermined pressure difference between the interior of said container and the exterior thereof for extending said bellows and said clamp into intimate contact with the cassette to compensate for nonuniformities in the cassette.

8. Apparatus for securing and precisely positioning a semiconductor slice cassette in a vacuum container, comprising:
a hollow bellows attached at one end to a clamp which is constructed and arranged to match with the cassette;
a cover enclosing the cassette and forming the vacuum container;
said bellows attached at a second end to said cover;
means for extending said bellows and said clamp into intimate contact with the cassette and to compensate for nonuniformities in the cassette;
wherein said clamp includes a cutout shaped to match with a portion of the cassette.

9. The apparatus of claim 7 wherein said means for extending said bellows includes a cylinder with an extendable piston secured at a first end to said clamp and secured at a second end to said cover.

10. Apparatus for securing and precisely positioning a semiconductor slice cassette in a vacuum container, comprising:
a hollow bellows attached at one end to a clamp which is constructed and arranged to match with the cassette;
a cover enclosing the cassette and forming the vacuum container;
said bellows attached at a second end to said cover;
means for extending said bellows and said clamp into intimate contact with the cassette and to compensate for nonuniformities in the cassette;
wherein said means for extending said bellows and said clamp comprises:
means for creating a lower pressure inside said container than outside said container;
a hole formed through said cover to communicate said higher pressure with the interior of said hollow bellows; and
said higher outside pressure causing said bellows and said clamp to extend and match with the cassette to secure the cassette.

11. Apparatus for securing and precisely positioning a semiconductor slice cassette in a vacuum container, comprising:
a hollow bellows attached at one end to a clamp which is constructed and arranged to match with the cassette;
a cover enclosing the cassette and forming the vacuum container;
said bellows attached at a second end to said cover;
means for extending said bellows and said clamp into intimate contact with the cassette and to compensate for nonuniformities in the cassette;
wherein said clamp further includes a protrusion passing through the hollow bellows and having a device attached so as to limit the extension of the bellows.

12. Apparatus for securing and precisely positioning a semiconductor slice cassette in a vacuum container, comprising:
a hollow bellows attached at one end to a clamp which is constructed and arranged to match with the cassette;
a cover enclosing the cassette and forming the vacuum container;
said bellows attached at a second end to said cover;
means for extending said bellows and said clamp into intimate contact with the cassette and to compensate for nonuniformities in the cassette;

wherein said bellows further includes a portion within said bellows for limiting cross-extension motion.

13. Apparatus for accurately positioning a semiconductor slice cassette in a vacuum container so that a semiconductor slice may be removed by an automatic device, comprising:
 a plurality of vertical guide posts constructed and arranged within the container to match with a left and a right vertical front edge of the cassette and to define an opening through which semiconductor slices can be removed from the cassette;
 a clamp sealingly attached to a hollow bellows, said clamp constructed and arranged to engage an upper rear edge of the cassette; and
 means for extending the bellows to match the clamp with the cassette to force the cassette into the vertical posts and accurately position the cassette.

14. The apparatus of claim 13, wherein said vertical posts have notches which match said left and right vertical front edges of the cassette.

15. The apparatus of claim 13, wherein said clamp includes a V-shaped portion shaped to match said upper rear edge of the cassette.

16. The apparatus of claim 13, wherein said clamp further includes means passing through said bellows into the mounting device and having a limiting ring attached to prevent said bellows from overextending.

17. The apparatus of claim 13, wherein said bellows includes a device for limiting extension of said bellows in a cross-extension direction.

18. The apparatus of claim 13, wherein said means for extending said bellows to match said clamp with the cassette comprises a two-way cylinder attached to said cover internal the vacuum container and including a piston passing through said bellows to attach to said clamp.

19. The apparatus of claim 13, wherein a reduced pressure is formed within said chamber and wherein said means for extending said bellows to match said clamp with the cassette comprises:
 a chamber formed within said hollow bellows and communicating external the container, such that said bellows and said clamp are extended to force the cassette into said vertical posts and level the cassette.

20. Apparatus for securing a work station within a container, comprising:
 a container;
 an extendable member within said container attached at a first end thereof to said container; and
 extender means responsive to a pressure lower within said container than external to said container for causing said extendable member to extend to secure the work station;
 wherein said extender means includes a passageway therein extending to the exterior of the container and hermetically sealed from the interior of said container.

21. The apparatus of claim 20, further comprising a clamp attached to a second end of said extendable member, for contacting the work station.

22. The apparatus of claim 20, wherein said extender means includes:
 a passageway to the outside of the container.

23. Apparatus for securing a work station within a container, comprising:
 an extendable member within the container and attached at a first end to the container; and
 extender means for causing said extendable member to extend to secure the work station, in response to a pressure lower inside the container than outside the container;
 wherein said extender means includes a passageway to the outside of the container;
 wherein said extender means includes:
 a chamber sealed from the inside of the container, and in communication with said passageway.

24. The apparatus of claim 23, wherein said extender means includes:
 chamber walls extendable by pressure higher within said chamber than within the inside of the container.

25. The apparatus of claim 24, wherein said chamber walls comprise:
 a bellows.

26. The Apparatus of claim 20, wherein the work station comprises:
 a cassette for semiconductor slices.

27. Apparatus for exerting force on a work station within a container, comprising:
 an extendable member within the container and attached at a first end to the container; and
 wherein said extendable member includes a chamber having walls expandable by a positive pressure within said chamber, wherein said chamber is in communication with the outside of the container and sealed from the inside of the container.

* * * * *